(12) United States Patent
Park et al.

(10) Patent No.: US 12,046,319 B2
(45) Date of Patent: Jul. 23, 2024

(54) REDUNDANCY MANAGING METHOD AND APPARATUS FOR SEMICONDUCTOR MEMORIES

(71) Applicants: SK hynix Inc., Icheon (KR); Korea University Research and Business Foundation, Seoul (KR)

(72) Inventors: Jong Sun Park, Seoul (KR); Kwan Ho Bae, Seoul (KR); Jun Hyun Song, Hwaseong (KR)

(73) Assignees: SK hynix Inc., Icheon (KR); Korea University Research and Business Foundation, Seoul (KR)

( * ) Notice: Subject to any disclaimer, the term of this patent is extended or adjusted under 35 U.S.C. 154(b) by 144 days.

(21) Appl. No.: 17/898,126

(22) Filed: Aug. 29, 2022

(65) Prior Publication Data

US 2023/0298686 A1    Sep. 21, 2023

(30) Foreign Application Priority Data

Mar. 17, 2022   (KR) .................. 10-2022-0033114

(51) Int. Cl.
  *G11C 29/00*  (2006.01)
  *G11C 29/52*  (2006.01)
(52) U.S. Cl.
  CPC .............. *G11C 29/76* (2013.01); *G11C 29/52* (2013.01); *G11C 29/785* (2013.01)
(58) Field of Classification Search
  CPC ........ G11C 29/76; G11C 29/52; G11C 29/785
  USPC ..................................................... 365/185.09
  See application file for complete search history.

(56) References Cited

U.S. PATENT DOCUMENTS

| | | | | |
|---|---|---|---|---|
| 7,546,439 | B1 * | 6/2009 | Cameron | G06F 12/1072 711/207 |
| 2020/0395093 | A1 * | 12/2020 | Kang | G11C 29/4401 |
| 2021/0295944 | A1 * | 9/2021 | Lim | G11C 29/4401 |

FOREIGN PATENT DOCUMENTS

| | | | | |
|---|---|---|---|---|
| KR | 20190062879 A | * | 6/2019 | G11C 29/72 |
| TW | 527490 B | * | 4/2003 | G11C 29/56 |

OTHER PUBLICATIONS

T.-W. Tseng et al., "ReBISR: A Reconfigurable Built-In Self Repair Scheme for Random Access Memories in SOCS", In IEEE Transactions on Very Large Scale Integration (VLSI) Systems, vol. 18, No. 6, Jun. 2010.
X. Wang et al., "Global Built-In Self-Repair for 3D memories with redundancy sharing and parallel testing," 2011 IEEE International 3D Systems Integration Conference (3DIC), 2011.
B.-Y. Lin et al., "Configurable Cubicle Redundancy Schemes for Channel-Based 3-D Dram Yield Improvement", Advances in 3-D Integrated Circuits, Systems, and CAD Tools, IEEE Design and Test, Jul. 10, 2015.
D. Han et al., "Effective Spare Line Allocation Built-in Redundancy Analysis With Base Common Spare for Yield Improvement of 3D Memory", IEEE Access, May 2021.

(Continued)

*Primary Examiner* — Ly D Pham

(57) ABSTRACT

A redundancy managing method and apparatus for semiconductor memories is disclosed. The redundancy managing method for semiconductor memories utilizes bitmap type storage by defining an appropriate storage space according to the type of a fault.

13 Claims, 16 Drawing Sheets

(56) References Cited

OTHER PUBLICATIONS

W. Jeong et al., "An Advanced BIRA for Memories with an Optimal Repair Rate and Fast Analysis Speed by Using a Branch Analyzer", IEEE Transactions on Computer-Aided Design of Integrated Circuits and Systems, vol. 29, No. 12, Dec. 2010.

W. Kang et al., "A Bira for Memories With an Optimal Repair Rate Using Spare Memories for Area Reduction", IEEE Transactions on Very Large Scale Integration (VSLI) Systems, vol. 22, No. 11, Nov. 2014.

K. Cho et al., "An Efficient BIRA Utilizing Characteristics of Spare Pivot Faults", IEEE Transactions on Computer-Aided Design of Integrated Circuits and Systems, vol. 38, No. 3, Mar. 2019.

C.-T. Huang, et al., "Built-In Redundancy Analysis for Memory Yield Improvement", IEEE Transactions on Reliability, vol. 52, No. 4, Dec. 2003.

H. Lee et al., "Fail Memory Configuration Set for RA Estimation", IEEE, International Test Conference, 2020.

K. Bae, "Area-Efficient BIRA for 3D Memory Utilizing the Characteristics of Global Spare Architecture", Master's Thesis, Department of Semiconductor Systems Engineering, The Graduate School of Korea University, Feb. 2022.

\* cited by examiner

: PARENT FAULT    : CROSS FAULT

REDUNDANCY MANAGING METHOD AND APPARATUS FOR SEMICONDUCTOR MEMORIES

CROSS-REFERENCE TO RELATED APPLICATION

This application claims priority under 35 U.S.C. § 119 to Korean Patent Application No. 10-2022-0033114 filed on Mar. 17, 2022, which is incorporated herein by reference in its entirety.

BACKGROUND

1. Field

Exemplary embodiments relate to a redundancy managing method and apparatus applicable to semiconductor memories, and more particularly, to more effectively managing global redundancies which are not distinguished in terms of row and column.

2. Discussion of the Related Art

As the processing technology for manufacturing a semiconductor integrated circuit continues to develop, the degree of integration of a semiconductor memory product has also greatly increased. Along with the higher integration, the number of faults of memory cells storing binary information also greatly increases in proportion thereto, and test costs increase as well. Although the technology of replacing a faulty cell with an appropriate spare cell in order to repair a fault has been used for a long time, the process of doing so becomes more and more complicated as the degree of integration increases.

In the technology of detecting a faulty cell and performing an appropriate repair in order to improve the yield of a memory product, in particular, the efficiency of utilization of the semiconductor area utilized to provide redundancies, the consumption of a time for repair, and the efficiency of repair are always considered as factors that influence the productivity of a semiconductor memory.

If a read or write operation of a memory cell fails to complete, the memory cell is determined as a cell with a fault. Depending on the type of a fault, a fault which solely occurs in a one-bit cell is referred to as a single fault, faults which are randomly distributed are referred to as random faults, a fault which occurs in a row direction of a memory cell array is referred to as a row fault, a fault which occurs in a column direction of the memory cell array is referred to as a column fault, and a fault where the row and column of other faults cross each other is called a cross fault.

Redundant cells which are prepared to replace faulty cells are referred to as spare cells or redundancies, and belong to each array, each block, each sector or each layer of memory cells. Names such as array, block, sector and layer are defined according to the capacity of a memory for convenience. Redundancies which are defined in each layer by being divided into row redundancies and column redundancies are referred to as local redundancies, and redundancies which are defined to repair memory cells regardless of rows and columns are referred to as global redundancies.

A process of preparing such redundancies in a semiconductor memory, analyzing faults, and then using the redundancies to repair the faults may be referred to as a built-in redundancy analysis (BIRA).

Hereinafter, in the conventional BIRA technology of handling faults, technology of collecting cross faults will be described. A cross fault may be repaired in both row and column directions (that is, using either a row redundancy or a column redundancy), but it is necessary to analyze which direction is advantageous for more efficient redundancy management. For example, FIG. 1 illustrates an example wherein there are three faults in one memory layer and the respective faults are located at points of (1,2), (1,6) and (5,6) among row addresses of R0 to R7 and column addresses of C0 to C7. Names such as array, block, sector and layer may be defined by dividing the total number of cells existing in a memory chip by appropriate capacities, or may mean a set of memory cells belonging to each chip in a device such as a high bandwidth memory (HBM) in which a plurality of memory chips are stacked and are coupled by through-silicon vias (TSV). Hereinafter, it is to be noted in advance that faults may be denoted by the symbol X in memory cells, may be numbered as #1, #2, . . . or may sometimes be denoted as '1' to indicate only the fact of the occurrence or existence of the faults. In FIG. 1, when a first fault #1 is detected, the address of the first fault #1 is stored in a space which stores information on parent faults, for example, a device such as a content addressable memory (CAM). FIG. 2 shows a parent CAM and a space which stores a child address. Index, En, LA, RA and CA denote an index indicating a parent fault, a memory layer number, a row address and a column address, respectively. When the value of En is 1, it is indicated that the space of a parent index A is used to store the address of a first fault. For reference, a child fault refers to a fault which is dependent on a parent fault and may be automatically repaired together when the parent fault is repaired. Note that as a result of how faults are determined to be parent faults, no parent fault will have the same column address as any other parent fault, and no will have the same row address as any other parent fault. As a corollary to this, no row or column of a layer can contain more than one parent fault.

When a second fault #2 is detected at the location of (1,6), since it may be known that the second fault #2 shares a row address with the first fault #1, the second fault #2 is classified as a child fault, and only a column address is written in the space which stores a child fault and is written as '6' in the example of FIG. 2. It is assumed that the child fault address storage space is configured by, for example, eight storage spaces and each storage space is divided into a row area and a column area in correspondence to indexes as shown in FIG. 2. As shown in FIG. 2, each location in the child fault address storage space corresponds to a predetermined index in the parent CAM, so that the '6' written in the top-left space in the child fault address storage space row area indicates a child fault in the same row as indicated by the parent CAM entry having the index A (here, where the RA for the entry with the Index of A is 1, row R1) and in column C6.

Then, when a third fault #3 is detected, since the address of the third fault #3 does not share a row address or a column address with the address of a previously detected parent fault (in this case, the first fault #1), the third fault #3 is also stored as a parent fault at the location of an index B, and values of En, LA, RA and CA become 1,1,5,6, respectively. Only after all the address storage spaces of child faults are searched may it be known whether the column address of the third fault is shared with the second fault, and as a result, it may be determined that the second fault is a cross fault. That is to say, since whether the second fault is a cross fault may be known only after the third fault is detected and the address of the third fault is analyzed, a disadvantage is caused in that a long determination time required.

Next, the conventional technology of analyzing cross faults using local redundancies (that is, row redundancies and column redundancies) will be described below with reference to FIG. 3. In the illustrative example shown, eight cross faults X have occurred in a certain memory layer 310 as shown in FIG. 3 and two row redundancies and two column redundancies are allocated, and explanation will be made by using this example. When the detected cross faults are separately indicated by addresses, a diagram denoted by the reference numeral '320' in FIG. 3 may be obtained. In the configuration of 320, '1' in a cell is to indicate that a cross fault has occurred at the location of the address thereof. A cross fault at the location of an address (7,1) indicated by the circular dotted line may be repaired using a row redundancy or a column redundancy. When four faults with addresses (2,1), (2,3), (5,1) and (5,3) are repaired using column redundancies, if the faults with addresses (7,1) and (7,7) are repaired using a row redundancy, the repairing of the fault at the address (7,1) using a row redundancy is repetitive because it has already been repaired using a column redundancy, and thus, inefficiency is caused in that a redundancy is wasted. This illustrates a disadvantage of an inefficient redundancy managing process.

Actually, there are six redundancy combinations that may be used for repairing the eight faults as shown in a configuration 330 of FIG. 3, and since a most efficient redundancy combination may be determined only after analyzing all of the combinations, a disadvantage is caused in that a time for repair is also greatly increased. This case is called an exhaustive search.

PRIOR ART DOCUMENT

Non-Patent Document (Non-patent Document 0001) "An Advanced BIRA for Memories with an Optimal Repair Rate and Fast Analysis Speed by Using a Branch Analyzer," IEEE Trans on Computer-Aided Design of Integrated Circuits and Systems, Vol. 29, No. 12, Dec., 2010
(Non-patent Document 0002) "A BIRA for Memories with an Optimal Repair Rate Using Spare Memories for Area Reduction," IEEE Trans on VLSI Systems, Vol. 22, No. 11, Nov., 2014
(Non-patent Document 0003) "An Efficient BIRA Utilizing Characteristics of Spare Pivot Faults", IEEE Trans on Computer-Aided Design of Integrated Circuits and Systems, Vol. 38, No. 3, Dec., 2019
(Non-patent Document 0004) "Built-In Redundancy Analysis for Memory Yield Improvement," IEEE Trans on Reliability, Vol. 52, No. 4, Dec., 2003

SUMMARY

Various embodiments are directed to achieving improvement in repair rate, shortening a time required for repair, and reducing an area occupied by redundancies used for repair, in order to provide more efficient repair in a redundancy managing method and apparatus for semiconductor memories.

In an embodiment, a redundancy managing method for semiconductor memories may include: detecting a fault of a memory cell, and classifying the fault as a parent fault; classifying a fault which shares a row address or a column address with the parent fault, as a child fault; using a bitmap storage space for the classifying of the child fault; and determining whether the child fault is a cross fault.

In an embodiment, a redundancy managing method for semiconductor memories may include: collecting a fault when redundancy management of a semiconductor memory is started; and analyzing whether the collected fault is a cross fault, the analyzing of a cross fault including determining whether a new parent fault matches with a child fault; when there is a match as a result of child fault match determination, determining the child fault as a cross fault, and updating information on a space which stores the child fault; and when there is no match as a result of child fault match determination, ending the analyzing.

In an embodiment, a redundancy managing method for semiconductor memories may include: detecting a fault by testing a semiconductor memory; pre-allocating a part of defined redundancies when the detected fault is a non-cross fault; post-allocating a fault which is not pre-allocated among detected faults; determining a determined cross fault when the pre-allocating is completed; and when a determined cross fault does not exist as a result of the determining, performing the post-allocating, and when a determined cross fault exists, allocating a redundancy.

In an embodiment, a redundancy managing apparatus for semiconductor memories may include: an array of semiconductor memory cells which store binary information; layers configured as the array is divided into a plurality of areas; redundancy cells defined to replace faults which occur in the array as a result of a test; a parent fault storage space storing an address where a parent fault among the faults occurs; and a bitmap storage space defined for a child fault among the faults, wherein locations corresponding to each row and each column of each layer are determined in advance.

According to the embodiments of the present disclosure, in managing redundancies for semiconductor memories, a higher repair rate is achieved. In addition, it is possible to provide a more efficient search and determination process so as to minimize a time required for repair. The area occupied by redundancies may therefore be minimized and efficiently used without waste.

DETAILED DESCRIPTION

Figure 1:
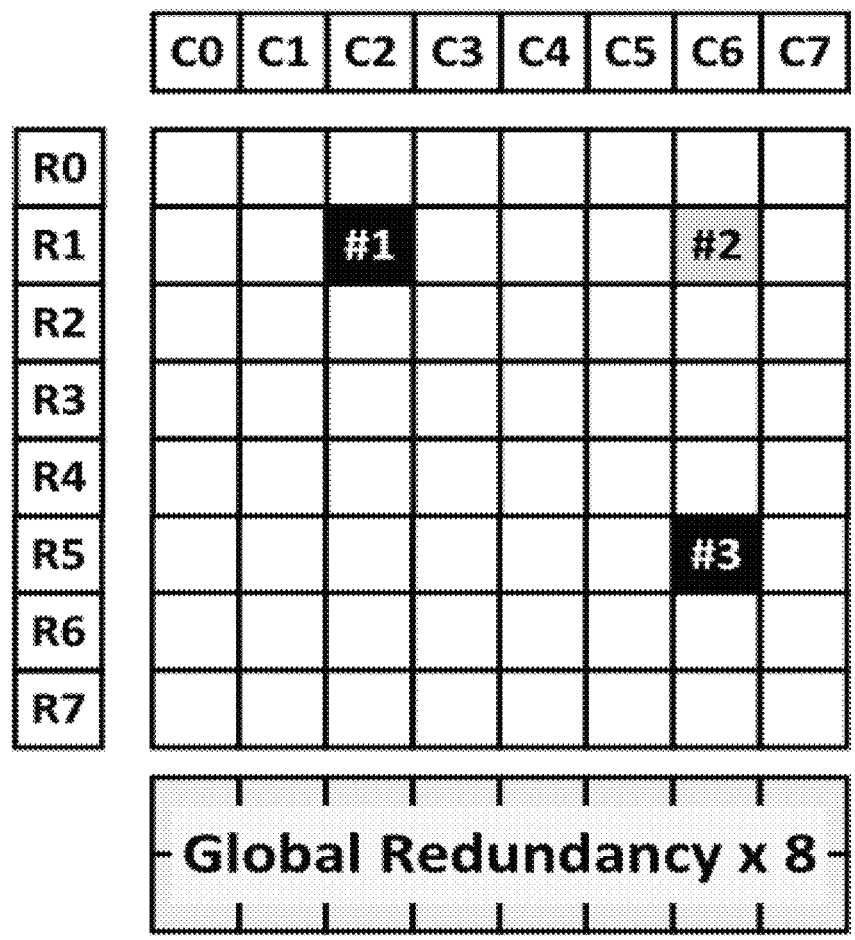
FIG. 1 shows examples of faults for explaining the prior art.
Figure 1:
Figure 1:
Figure 2:
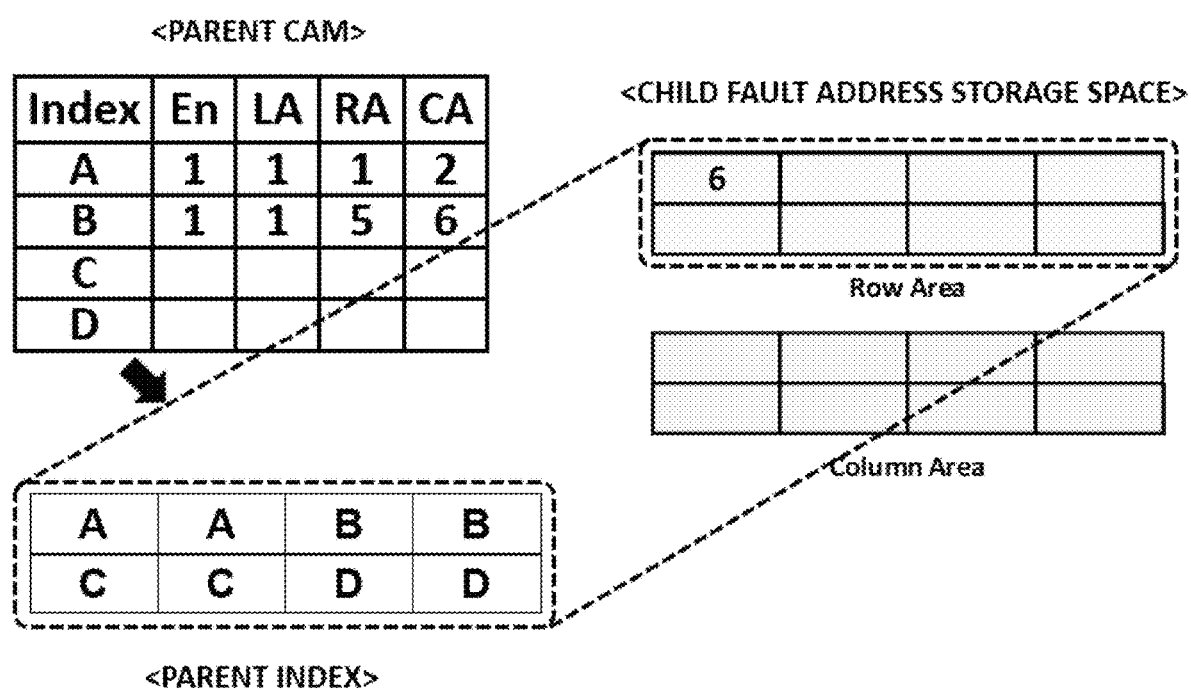
FIG. 2 illustrates parent faults and a child fault in the prior art.
Figure 3:
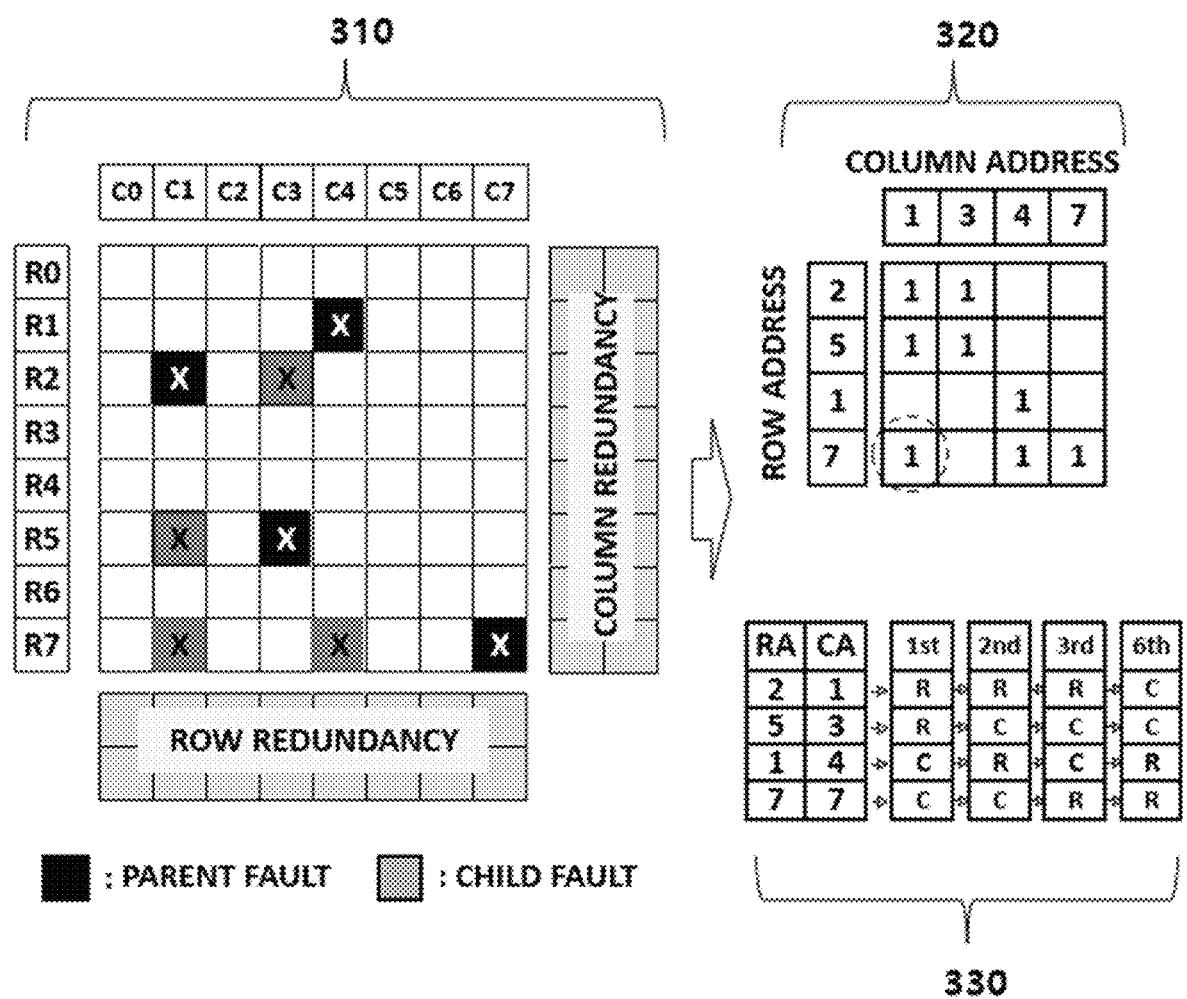
FIG. 3 illustrates a limitation of an exhaustive fault search for a local redundancy.

Hereinafter, various embodiments will be described in detail with reference to the accompanying drawings to the extent that a person skilled in the art to which the embodiments pertain may easily implement the embodiments. Among the reference numerals presented in the drawings, like reference numerals denote like elements.

In describing the present disclosure, when it is determined that the detailed description of the known related art may obscure the gist of the present disclosure, the detailed description thereof will be omitted.

Although the terms such as first and second may be used to describe various components, the components are not limited by the terms, and the terms are used only to distinguish components from other components.

Hereinafter, in the specification of the present disclosure, it is to be noted in advance that faults may be denoted by the symbol X in memory cells, may be numbered as #1, #2, . . . to emphasize search order or may sometimes be denoted as '1' to indicate only the fact of the occurrence or existence of the faults.

A. Bitmap Storage Type Fault Collection

Figure 4:
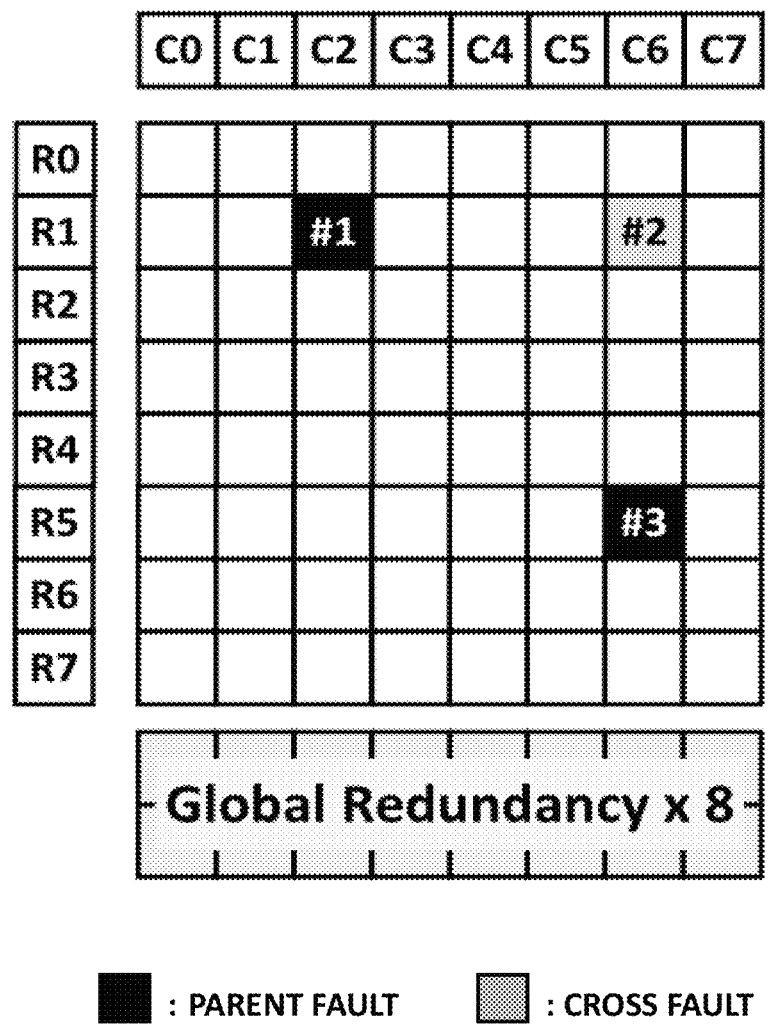
FIG. 4 is a diagram for explaining the present disclosure, showing an example in which faults exist.

In an embodiment of the present disclosure, a process of collecting information on faults of faulty memory cells, storing the information on the faults in a bitmap format, and repairing a semiconductor memory using the information on the faults stored in the bitmap format is used. In order to illustrate the operation of the process, an example of a memory layer having three faults is shown in FIG. 4. In FIG. 4, the three faults are denoted by #1, #2 and #3, respectively, and are located at points of (1,2), (1,6) and (5,6) among row addresses of R0 to R7 and column addresses C0 to C7, where the first number of each point indicates the row and the second number indicates the column. The orders of the three faults are numbered, for convenience, in a sequence in which the three faults are detected as faults. Since a first fault #1 is first detected, the first fault #1 is classified as a parent fault, and since it is known at a moment when a second fault #2 is detected that the second fault #2 shares a row address with the first fault #1, the second fault #2 is classified as a child fault. Because it is not checked at the time when the second fault #2 is detected whether the second fault #2 is a cross fault, the second fault #2 is initially classified as a non-cross child fault. When a third fault #3 is detected, the third fault #3 becomes a new parent fault, and since it can be determined at this time that the second fault #2 shares a column address with the third fault #3 (as well as sharing a row address with the first fault #1 as was previously determined), the second fault #2 is determined to be a cross fault.

Figure 5:
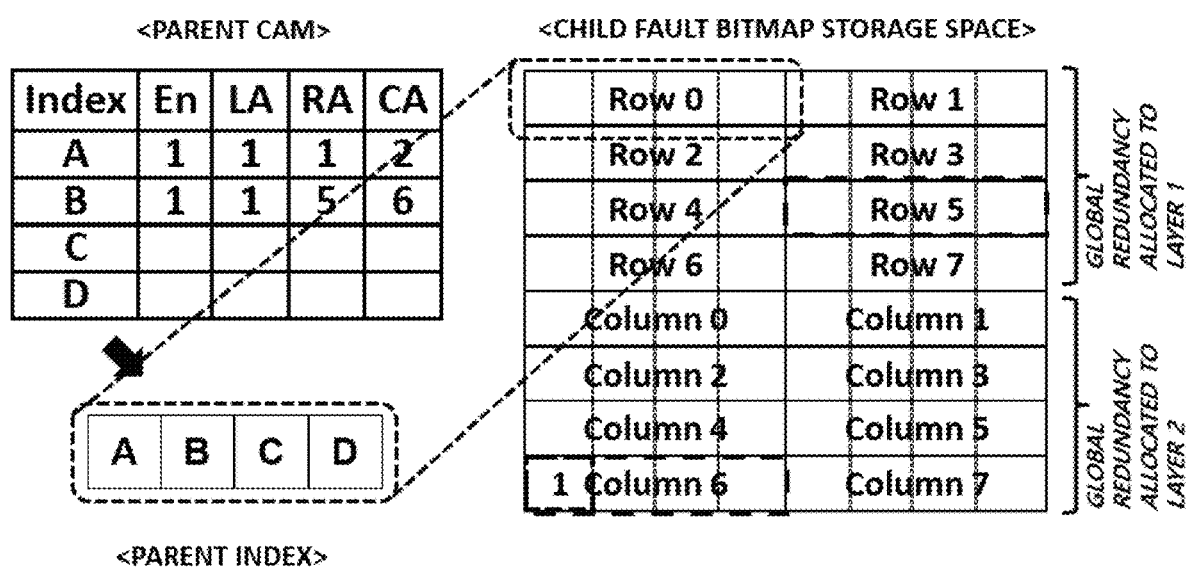
FIG. 5 illustrates a bitmap for explaining a process of managing parent faults and a child fault in the present disclosure.

FIG. 5 shows a parent CAM as a space which stores the address of a parent fault and a child bitmap storage space which stores the address of a child fault. Since these spaces need to store not data but addresses, for example, a device such as a content addressable memory (CAM) may be utilized. As described above with reference to FIG. 4, there are two parent faults denoted by #1 and #3. Since the row addresses and column addresses of the parent faults #1 and #3 are (1,2) and (5,6), respectively, indexes are denoted by A and B in the parent CAM, and the addresses are stored in respective spaces for row address RA and column address CA. For reference, the symbol LA is an address which identifies a memory layer, and a value '1' stored in LA indicates the number of a layer. The symbol En is a flag signal indicating whether the address of a parent fault is stored in that parent CAM entry. In the example, indexes A, B, C and D indicate that up to four parent faults may be stored, but embodiment are not limited thereto.

In the bitmap storage space which stores child faults, total eight row address entries Row0 to Row7 are allocated to a layer. Each of the row address entries Row0 to Row7 includes a plurality of bit that respectively correspond to an entry in the parent CAM. The bitmap storage space also includes eight column address entries Column0 to Column8 allocated to the layer. Accordingly, because the second fault #2 is a child fault which shares a row address with the first fault #1, and the first fault #1 is recorded in the entry with index A in the parent CAM, the second fault #2 is indicated by setting a bit corresponding to the index location of A in column address entry Column6 corresponding to a column address of '6.' Since it is sufficient to simply record that the second fault #2 has been detected, '1' as a flag signal is recorded instead of recording the column address. Here, it should be noted that a bitmap storage space in which the row address is recorded is a space belonging to the layer being analyzed (here, Layer 1) and a bitmap storage space in which the column address is recorded is a space which is borrowed from a second memory layer Layer2 among memory layers and that, since fault collection (that is, the process of detecting faults) for the second memory layer (LA=2) is not performed while fault collection is currently performed for a first memory layer (LA=1), the space from the second memory layer Layer2 may be borrowed.

Figure 6:
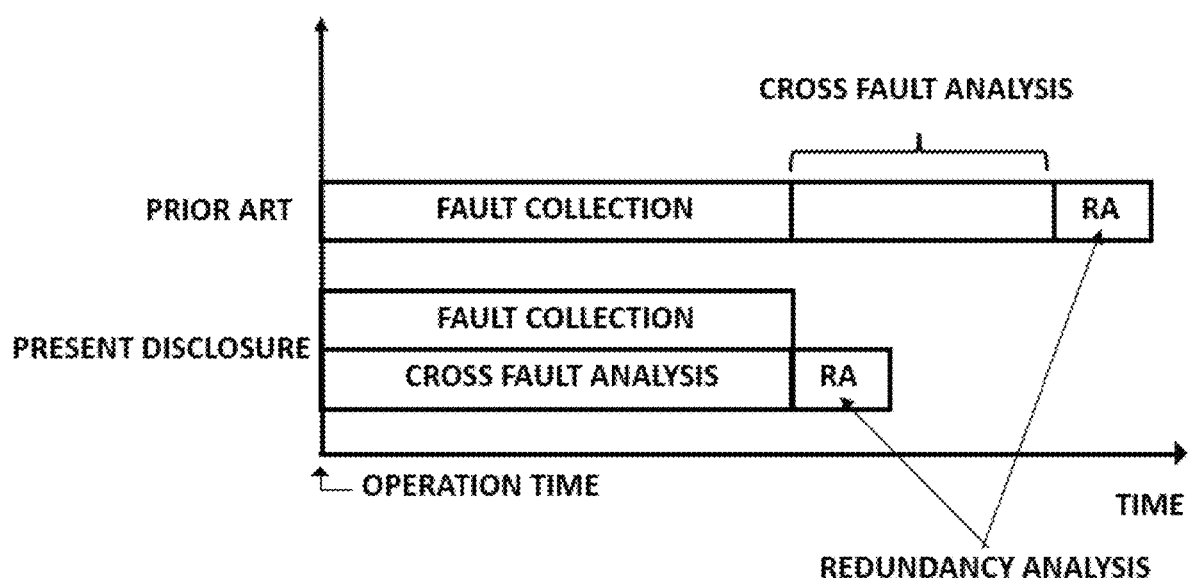
FIG. 6 is a comparison diagram showing the effects of the present disclosure.

Then, the third fault #3 is detected and, because it has neither a row nor a column with any previously-detected parent fault, is stored as a parent fault, and at the same time it is determined whether a child fault corresponds to a cross fault. In this case, there is no need to search all addresses, and it is sufficient to search for only the row address of R5 and the column address of C6 of the third fault #3 in the bit map storage space, and by doing so, the second fault #2 is determined to be a cross fault. Therefore, by dynamically determining, in parallel with performing fault collection, whether a fault corresponds to a cross fault, search time may be saved, and it is possible to analyze a fault in a more direct and efficient manner by utilizing the bitmap storage space. Comparison between the advantage of the present disclosure in terms of analysis time and prior arts is shown in FIG. 6.

Figure 7:
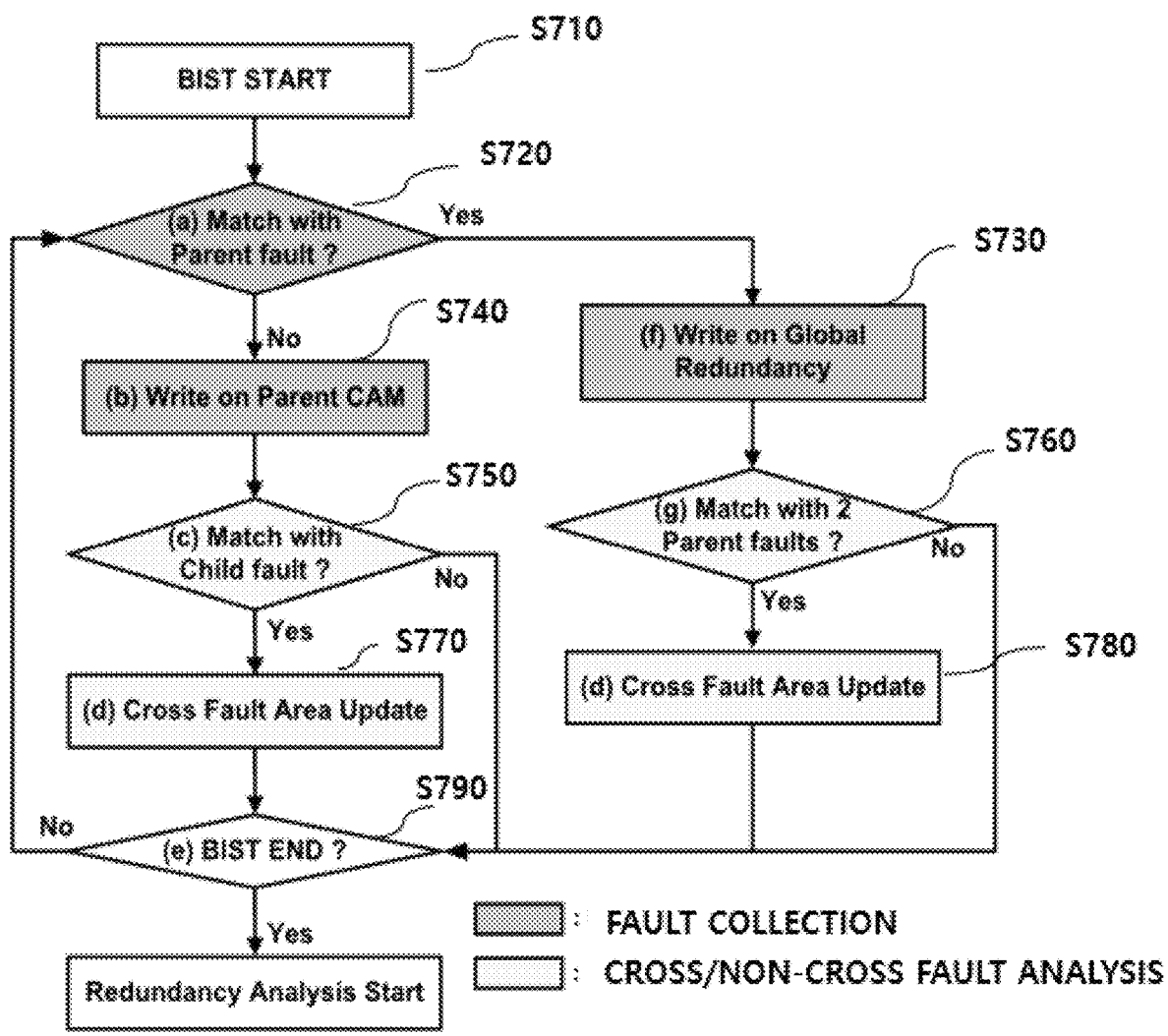
FIG. 7 is a flowchart of an analysis of a cross fault in the present disclosure.

The above-described operation may be illustrated as a flowchart as shown in FIG. 7. When analysis is started (S710), a process of collecting faults includes the following flow. First, the process determines whether there is a row or column match between a detected fault and a fault previously stored in the parent CAM (S720). When there is a match, that is, when the detected fault is in a same column of a fault in the parent CAM, is in a same row as a fault in the parent CAM, or both, a redundancy fault counter associated with the fault in the parent CAM is updated (such as the Rcnt counter or the Ccnt counter disclosed in FIG. 8, according to whether the row or column address was matched), and the newly detected child fault is recorded in a space which stores faults that may be corrected using a global redundancy (S730), and when there is no match, that is, when the detected fault is in neither a same column nor a same row as any fault in the parent CAM, the detected fault is written as a new parent fault in the parent CAM (S740). After the fault collection is performed, a step of analyzing whether a fault corresponds to a cross fault is performed and includes the following flow. First, for the fault having been recorded in the parent CAM in step S740, it is determined whether that parent fault has a row or column that matches with a row or column of any child fault (S750). When it is determined that there is a match, since the child fault will be a cross fault, information on a space which stores a child fault is updated (S770), and when there is no match, the analysis is ended (S790). For the fault having been recorded as a child fault in step S730, it is determined whether that child fault has a row that matches a row of a first parent fault and a column that matches a column of a second parent fault (S760). When there is both the row match and the column match, a space which stores a cross fault is updated (S780), and when there is no match, the step of determining whether a fault corresponds to a cross fault is ended (S790).

B. Analysis and Repair Algorithm

Figure 8:
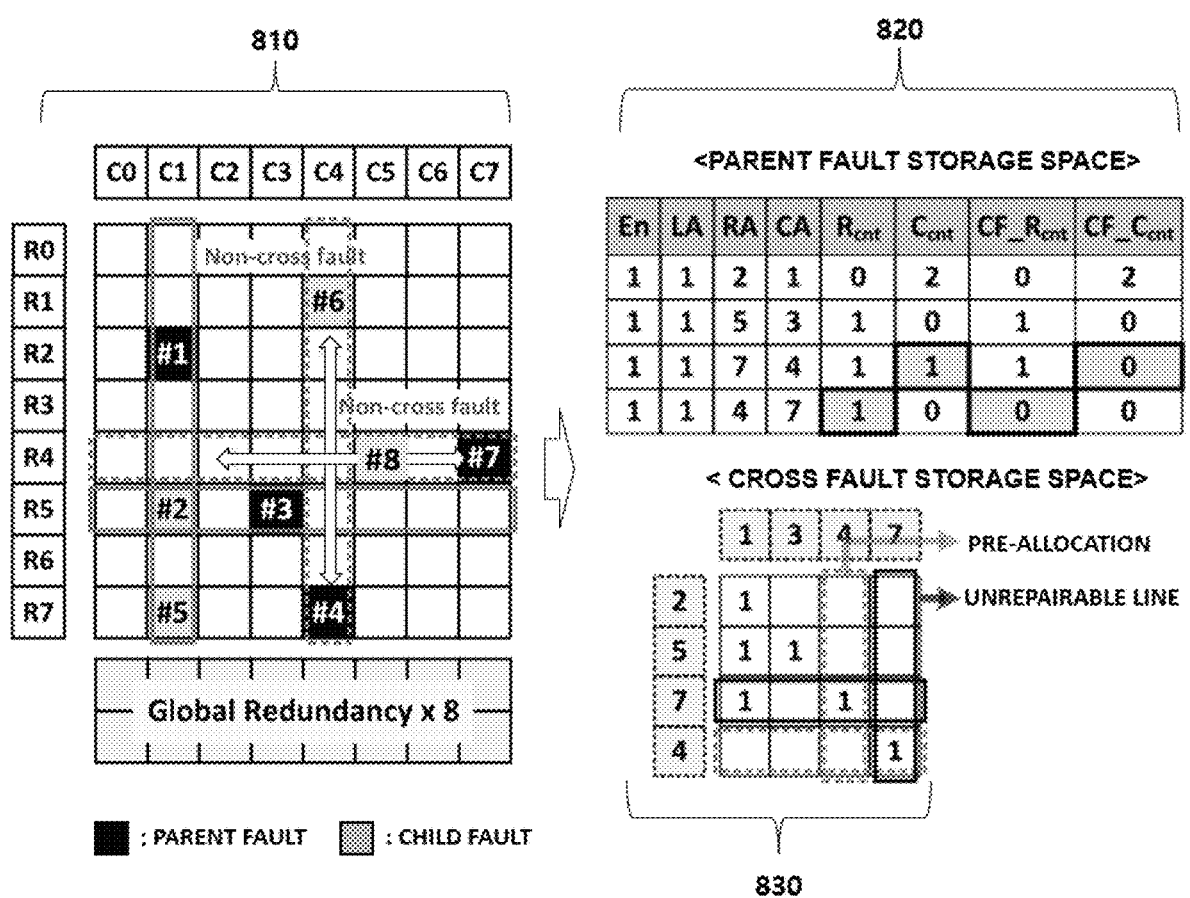
FIG. 8 is a diagram for explaining a pre-allocation.

An analysis algorithm applied to allocate redundancies and perform repair in the present disclosure will be described below with reference to FIG. 8. FIG. 8 exemplifies a memory layer which has eight rows and eight columns, and it is assumed that global redundancies which do not need to distinguish row redundancies and column redundancies are used. As shown in FIG. 8, it is assumed that eight faults #1 to #8 have been detected in a certain layer 810, four faults have been determined as parent faults and the remaining four faults have been determined as child faults. Next step of analysis is step of determining whether the detected faults are cross faults.

In FIG. 8, the child faults at locations of addresses (5,1) and (7,1) are cross faults, and the child faults at locations of addresses (1,4) and (4,5) are non-cross faults. For the non-cross child faults, a pre-allocation step of pre-allocating whether to use row redundancies (for non-cross child faults that share a row address with a parent fault) or column redundancies (for non-cross child faults that share a column address with a parent fault) is performed. A cross fault storage space 830 of FIG. 8 is shown in a matrix form. '1' in a matrix cell denotes the pre-allocation indicating a fault at the location of a corresponding address, the dotted lines indicate the pre-allocation, and the solid lines separately indicate unrepairable lines. In the case of FIG. 8, when the pre-allocation step is performed, a column redundancy is pre-allocated to a (7,4) parent fault and row redundancy is allocated to a (4,7) parent fault. The pre-allocation of the column redundancy to repair the (7,4) parent fault is performed because that pre-allocation also repairs the non-cross child fault (1,4), and the pre-allocation of the row redundancy to repair the (4,7) parent fault is performed because that pre-allocation also repairs the non-cross child fault (4,5).

The reference numeral 820 of FIG. 8 denotes a parent fault storage space shown in a matrix form on the basis of a row address and a column address where a parent fault has occurred. En, LA, RA, and CA denote whether an index indicating a parent fault is enabled, the number of a memory layer, a row address, and a column address, respectively. Furthermore, Rcnt, Ccnt, CF_Rcnt and CF_Ccnt denote counter values of row-direction child faults, column-direction child faults, row-direction cross faults and column-direction cross faults, respectively.

In the example of FIG. 8, the remaining faults to which redundancies are not allocated in the pre-allocation step are allocated so as to prevent redundancies from being wasted. For example, the fault (7,1), should be allocated with a column redundancy because if a row redundancy were allocated to the fault (7,1), redundancy waste is caused because the fault (7,4) pre-allocated by the pre-allocation will be repetitively allocated with a redundancy. In the present disclosure, a cross fault in which the direction of a redundancy has been determined, such as the fault (7,1) as described above, is specifically defined as a 'determined cross fault' or a 'determined fault', and the corresponding process is referred to as 'determined fault step.' For a parent fault (5,3) which remains by being not yet allocated with a redundancy, since any one of a row redundancy and a column redundancy may be selected, a column redundancy is allocated for convenience. This step is a post-allocation step.

Figure 9:
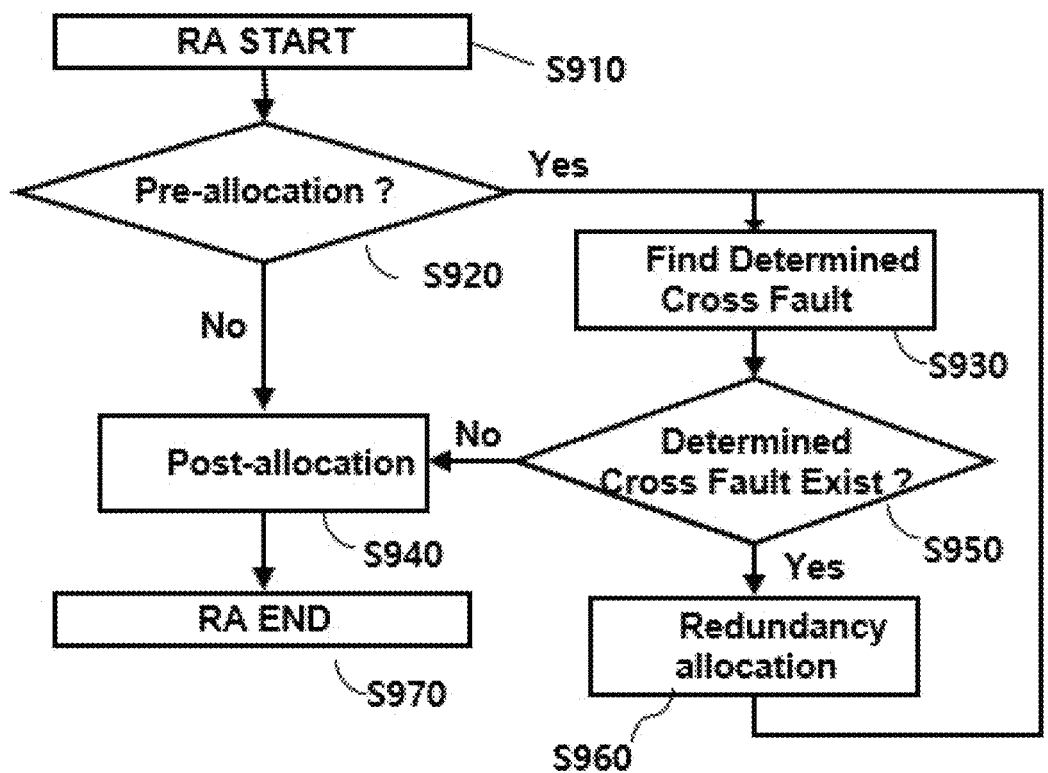
FIG. 9 is a flowchart of a redundancy analysis.

Such a series of processes may be illustrated as a flowchart as shown in FIG. 9. When analysis for redundancy utilization is started (S910), the redundancy analysis determines whether at least one non-cross child fault (and corresponding parent fault) is pre-allocated (S920). When the redundancy analysis determines that there is such pre-allocation (S920, "Yes" branch), the redundancy analysis begins a process of determining cross faults (S930), and when there is no pre-allocation (S920, "No" branch), the redundancy analysis begins a process of performing post-allocation (S940). When a cross fault that may be determined exists (S950, "Yes"), a global redundancy is allocated to that cross fault and one of the corresponding parent faults (S960), at which point the cross fault is considered a determined cross fault. The steps S930, S950 and S960 are repeatedly performed until there are no cross faults left to be determined; that is, no cross faults that are not allocated a redundancy. When there are no more cross fault to be determined (S950, "No" branch), the post-allocation process is performed (S940). When post-allocation for all faults is completed, the redundancy analysis is ended (S970).

C. Comparison Experiments

Figure 10:
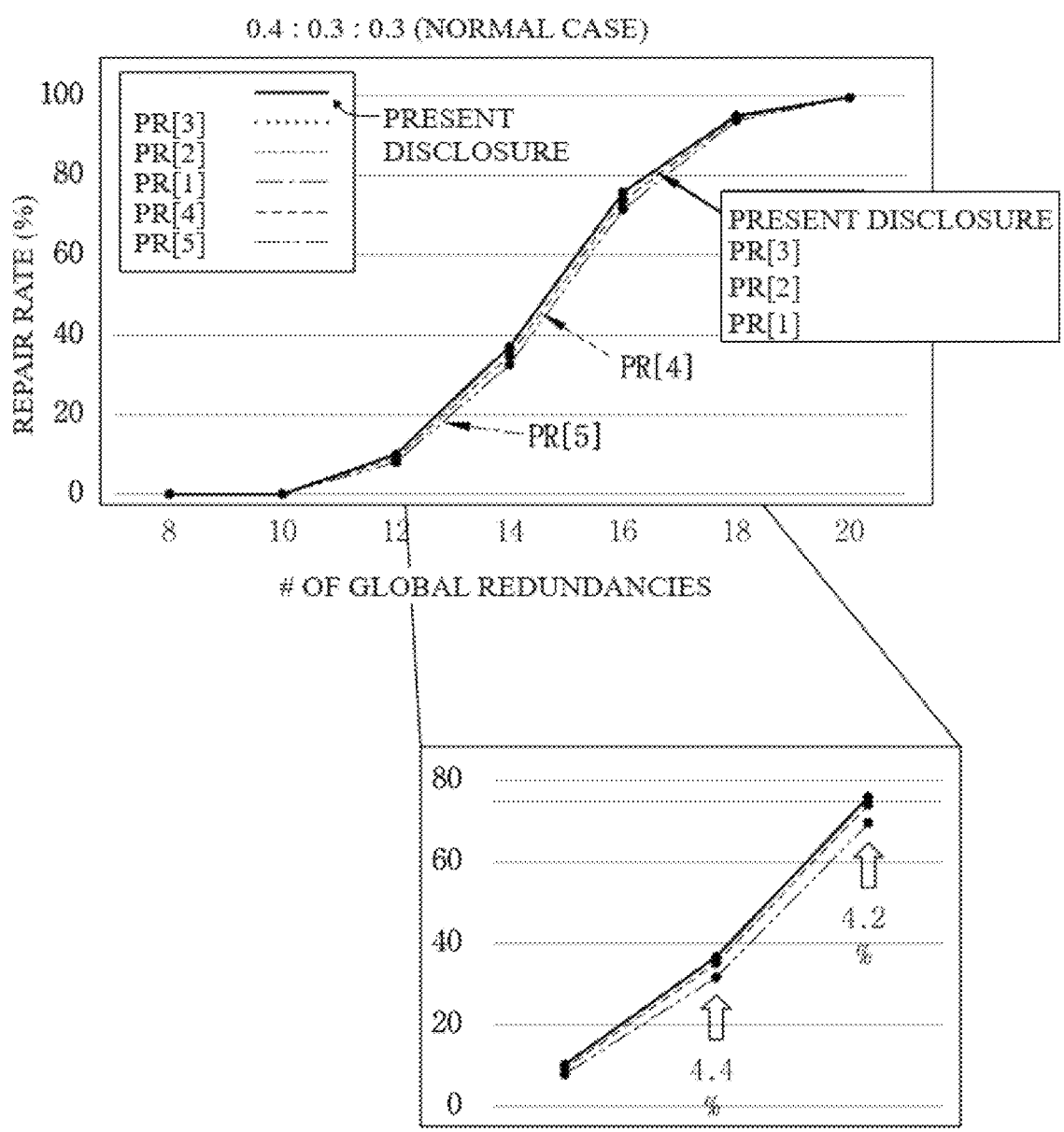
FIG. 10 illustrates a result of comparison experiments for repair rate.
Figure 11:
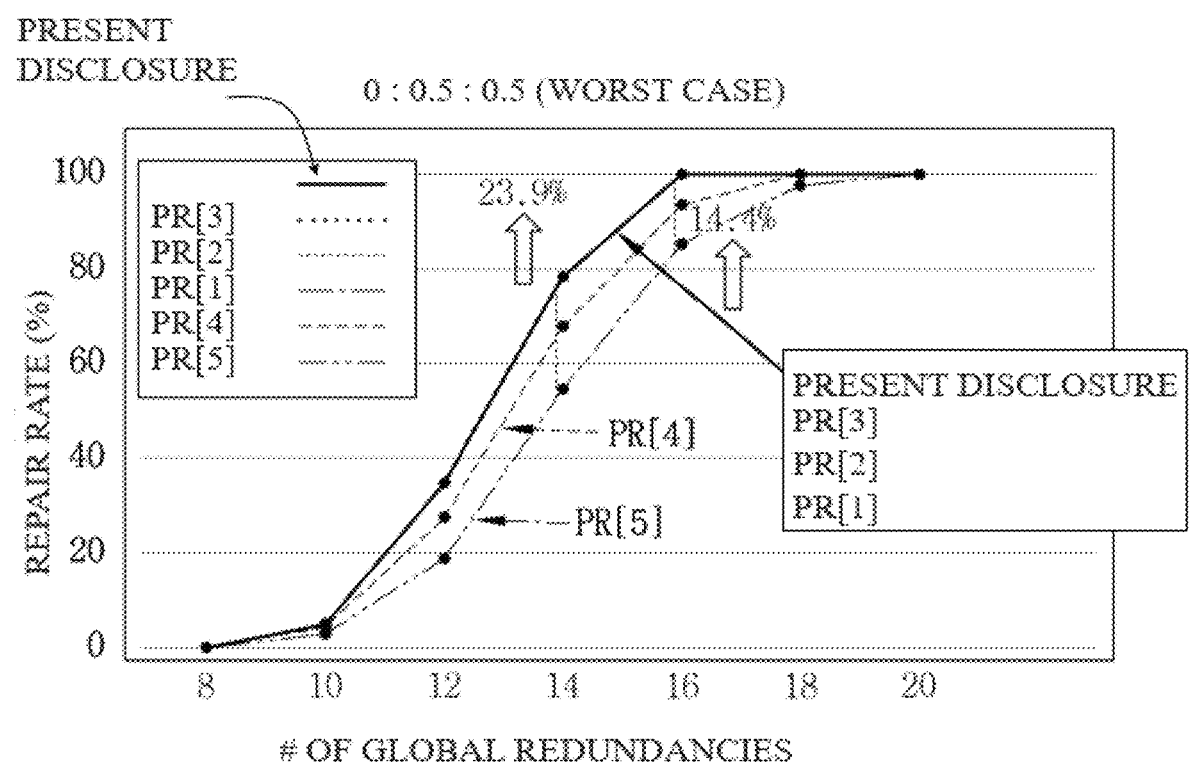
FIG. 11 illustrates another result of comparison experiments for repair rate.

In order to confirm the effects of the present disclosure, the technologies of the above-mentioned five prior art documents and the present disclosure were compared for various factors. The five prior art documents are shown in respective figures by being denoted by 'PR[1],' 'PR[2],' 'PR[3],' 'PR[4]' and 'PR[5],' respectively. Among them, PR[4] and PR[5] are described as different examples in the same prior art document. Comparison for repair rate among various factors is shown in FIGS. 10 and 11. In these figures, the horizontal axis represents the number of global redundancies, and the vertical axis represents a repair rate. In addition, an experiment condition in these figures relates to 1,000 experiment sets in which the number of memory cells is 1024×1024 and four layers are used. Moreover, FIG. 10 shows a normal case in which four faults exist in each layer and the ratio of the types of faults (single fault:row-direction fault:column-direction fault) is 0.4:0.3:0.3. FIG. 11 shows a worst case in which eight faults exist in each layer and the ratio of the types of faults is 0:0.5:0.5. In FIG. 10, in the normal case, improvement in repair rate is insignificant compared to the five prior art documents cited in the specification of the present disclosure, and several lines overlap with one another to be difficult to be distinguished. However, in the worst case of FIG. 11, the repair rate is sharply improved by the embodiment of the present disclosure, and the performance is improved by 23.9% and 14.4%, respectively, compared to the two technologies suggested in the prior art document 4.

Figure 12:
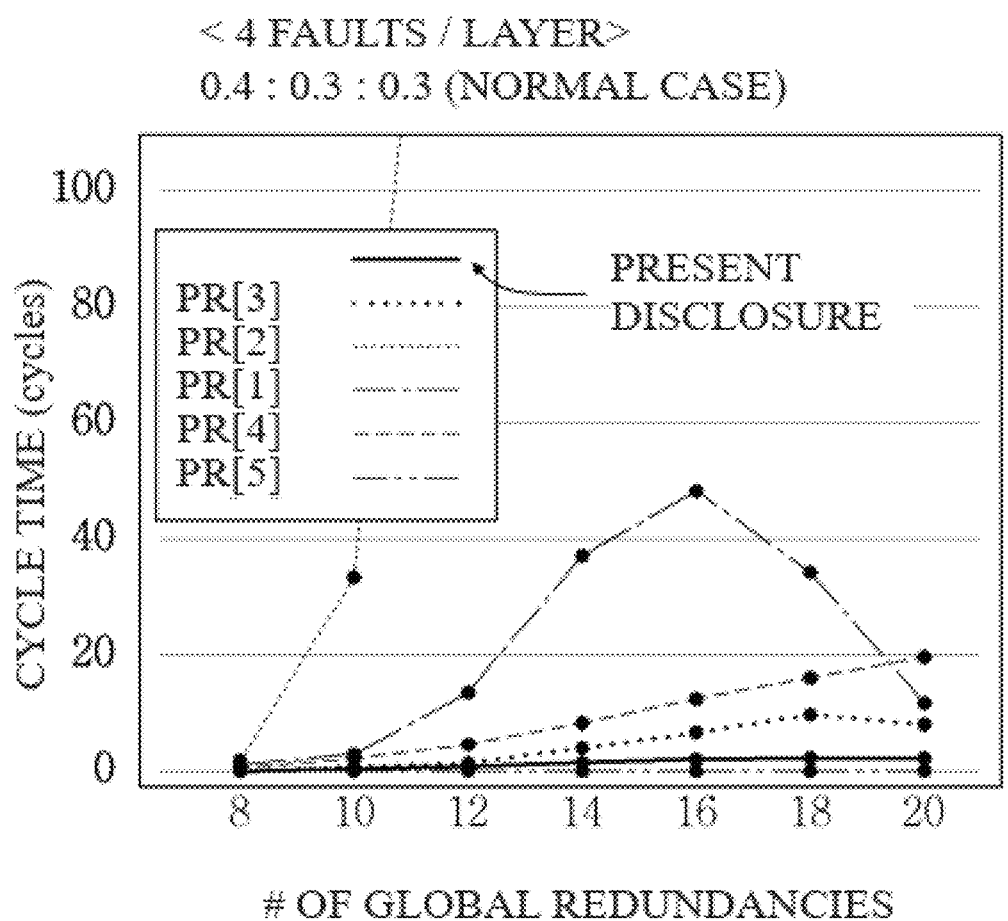
FIG. 12 illustrates a result of comparison experiments for redundancy analysis time.
Figure 13:
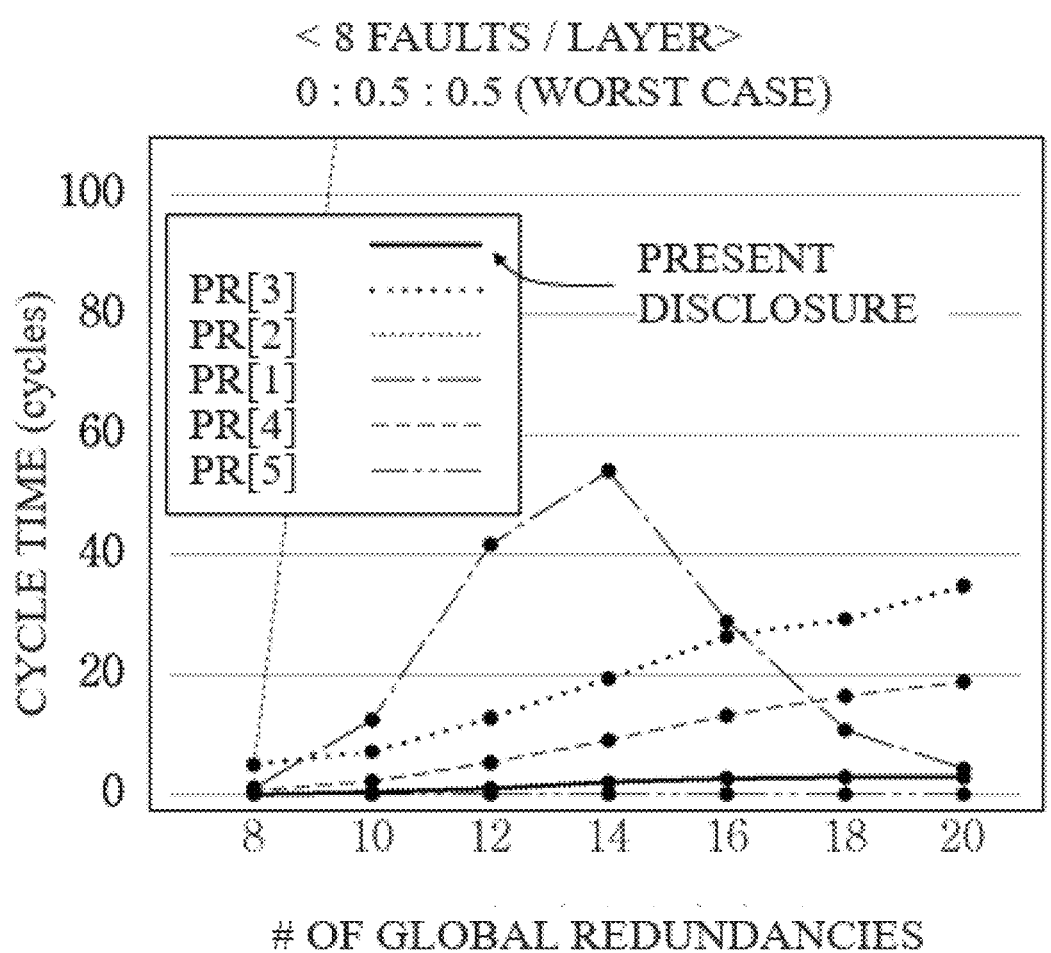
FIG. 13 illustrates another result of comparison experiments for redundancy analysis time.

Comparison experiment results for redundancy analysis time are shown in FIGS. 12 and 13. An experiment condition is the same as that in FIGS. 10 and 11. It may be seen that, in each of the normal case of FIG. 12 and the worst case of FIG. 13, a rate at which an analysis time increases as the number of global redundancies increases is minimized in the present disclosure. In the case of FIG. 12, four faults per layer are assumed, and in the case of FIG. 13, eight faults per layer are assumed. Such experiment results are due to the fact that the characteristic of the present disclosure for redundancy analysis time is non-exhaustive and reveals a low increase state at a constant rate regardless of the number of spare cells.

Figure 14:
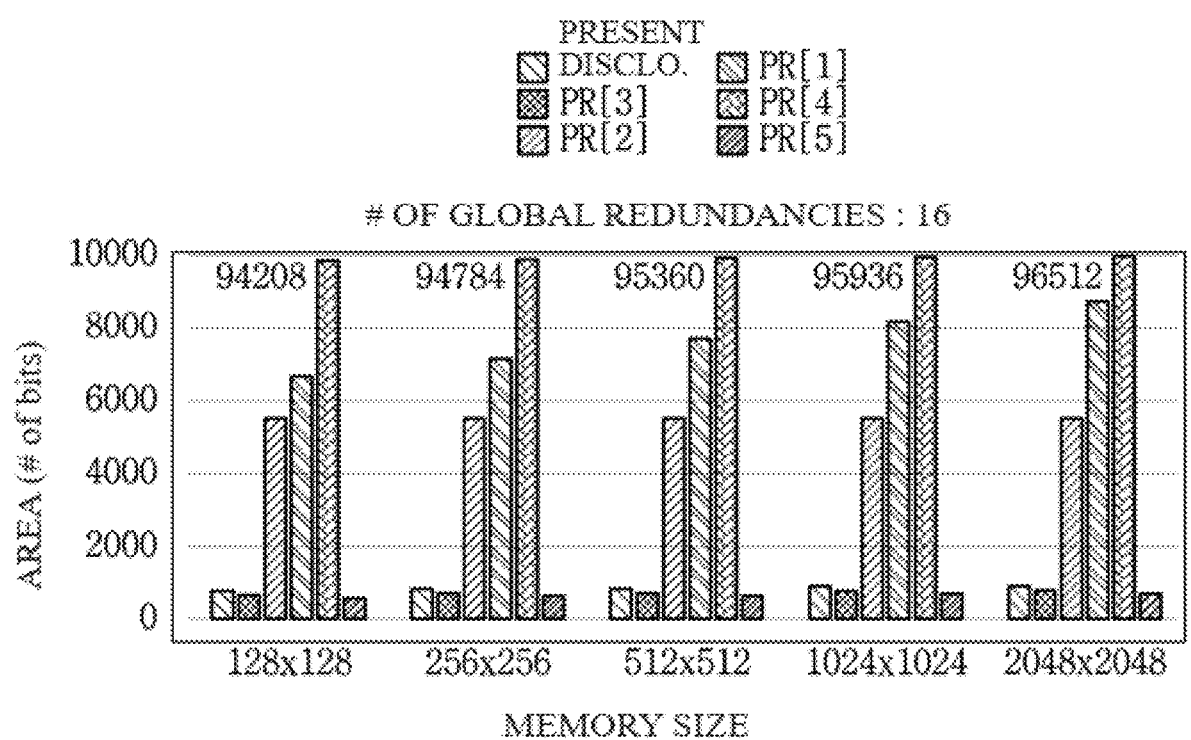
FIG. 14 illustrates a result of experiments comparing redundancy area efficiencies according to memory capacities.

Comparison for area to be occupied by a semiconductor memory when the redundancy analysis process according to an embodiment of the present disclosure is applied is shown in FIG. 14. It is assumed that there are 16 global redundancies per layer. The horizontal axis represents the magnitude of a memory capacity, and the vertical axis represents an area occupied by redundancies on the basis of the number of memory bits storing binary information. It may be seen that, when the redundancy analysis process of the present disclosure is applied, an increase in an area occupied by redundancies is maintained at a lowest level even when a memory capacity is increased, compared to the prior art documents.

Figure 15:
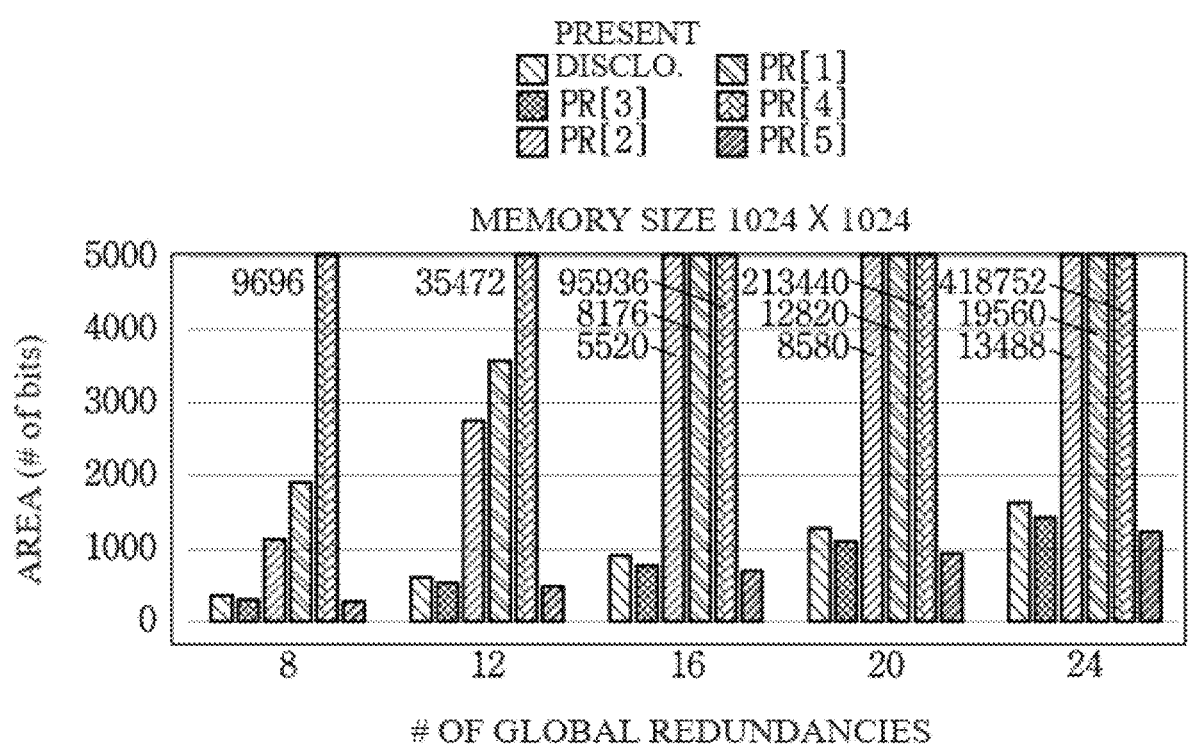
FIG. 15 illustrates a result of experiments comparing redundancy area efficiencies according to the numbers of global redundancies.

FIG. 15 shows results of experiments performed for increase in area occupied by redundancies, by taking the number of global redundancies as the horizontal axis, and it may be seen that an increase in area due to an increase in the number of redundancies is also minimized compared to the five prior arts as comparison targets.

Figure 16:
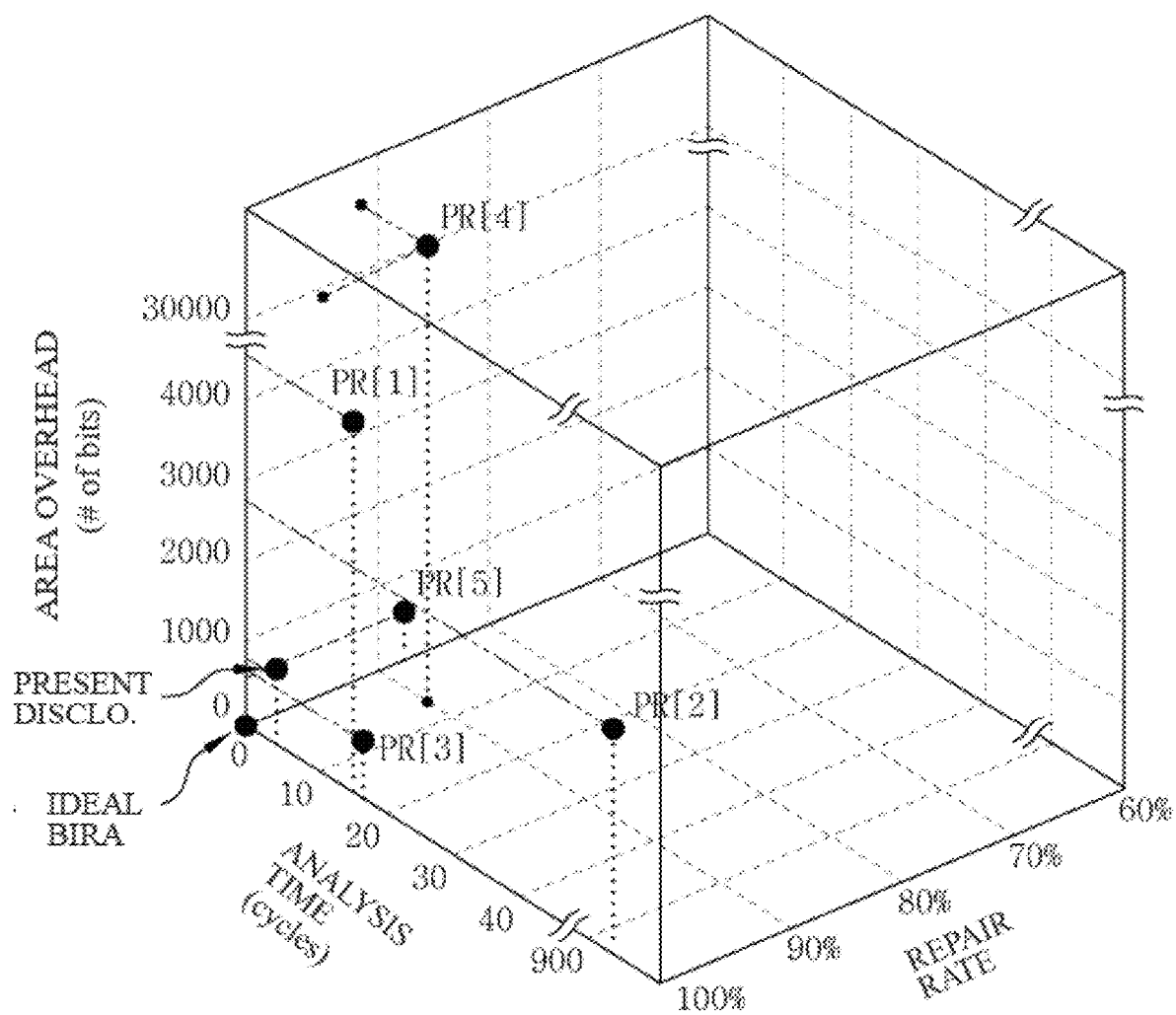
FIG. 16 is a diagram three-dimensionally showing the effects of the present disclosure for three factors.

By three-dimensionally plotting, in one diagram, experiment results for the above-described three factors determining the performance of redundancies, that is, repair rate, analysis time and area occupied by redundancies, the advantages of the present disclosure may be more clearly understood. FIG. 16 shows the experiment results, and effects achieved by the present disclosure compared to those of the prior arts may be seen through respective coordinates. The respective axes forming a plane indicate repair rate and analysis time, and the vertical axis indicate area overhead occupied by redundancies. When comparing the data of the five prior arts and the present disclosure described above on a three-dimensional graph, it may be seen that the data of the present disclosure is closest to a most ideal BIRA (built-in redundancy analysis).

As is apparent from the above description, the repair efficiency of the present disclosure may be compared and determined by using factors such as repair rate, analysis time of redundancies for repair, and area occupied by redundancies. Therefore, using the methods and apparatuses for managing memory redundancies of the present disclosure, it is possible to achieve an increase in repair rate, a reduction in analysis time, and a minimization in additional area required to implement the redundancies, thereby ultimately reducing test costs.

Embodiments of the present disclosure may use circuits incorporated in a memory device, including logic circuits. In embodiments, the logic circuits may include a processor or microcontroller that participates in the performance of the processes herein by executing instructions stored in a non-transitory computer-readable media. Although preferred embodiments of the disclosure have been disclosed for illustrative purposes, those skilled in the art will appreciate that various modifications, additions and substitutions are possible, without departing from the scope and spirit of the disclosure as defined in the accompanying claims. Thus, the true technical scope of the present disclosure should be defined by the technical spirit of the appended claims.

What is claimed is:

1. A redundancy managing method for semiconductor memories performed by a processing unit, the method comprising:
   detecting a first fault of a memory cell having a row address and a column address, and classifying the fault as a parent fault;
   classifying a second fault which shares the row address or the column address, as a child fault;
   using a bitmap storage space for the classifying of the child fault; and
   determining whether the child fault is a cross fault or a non-cross fault.

2. The redundancy managing method according to claim 1, wherein the classifying of the parent fault comprises:
   storing the row address and the column address in a separate storage space.

3. The redundancy managing method according to claim 2, wherein the separate storage space is a content addressable memory (CAM).

4. The redundancy managing method according to claim 1, wherein the classifying of the parent fault comprises:
   storing memory layer information, the row address, and the column address in a content addressable memory.

5. The redundancy managing method according to claim 1, wherein in the bitmap storage space, a space corresponding to an address of the child fault is designated in advance.

6. The redundancy managing method according to claim 5, wherein in the bitmap storage space, a space corresponding to a row address where the child fault has occurred and a space corresponding to a column address where the child fault has occurred are separately designated.

7. The redundancy managing method according to claim 5, wherein in the bitmap storage space, redundancies defined for different memory layers are able to be shared by being borrowed.

8. The redundancy managing method according to claim 5, wherein using the bitmap storage space includes storing a flag, indicating occurrence of the child fault, in a predetermined location instead of storing an address.

9. The redundancy managing method according to claim 1, wherein determining whether the child fault is a cross fault or a non-cross fault is performed by comparing row addresses and column addresses in the bitmap storage space.

10. The redundancy managing method according to claim 1, wherein detecting a fault of a memory cell and classifying the fault as a parent fault comprises:
    determining whether there is a match between the detected fault and a fault which was previously stored in a parent fault storage space;
    when it is determined that there is a match, updating a redundancy fault counter; and
    when it is determined that there is no match, writing a new parent fault in the parent fault storage space.

11. The redundancy managing method according to claim 1, wherein determining whether the child fault is a cross fault or a non-cross fault comprises:
    determining whether a new parent fault matches the child fault; and
    when it is determined that the new parent fault matches the child fault, determining the child fault as a cross fault and updating information on a space which stores the child fault.

12. The redundancy managing method according to claim 11, wherein determining whether the child fault is a cross fault or non-cross fault further comprises:
  detecting a fault by testing a semiconductor memory;
  pre-allocating a part of defined redundancies when the detected fault is a non-cross fault;
  post-allocating a fault which is not pre-allocated among detected faults;
  determining a determined cross fault when the pre-allocating is completed; and
  when a determined cross fault does not exist as a result of the determining, performing the post-allocating, and when a determined cross fault exists, allocating a redundancy.

13. The redundancy managing method according to claim 12, wherein in the pre-allocating, the detected fault includes a parent fault.

\* \* \* \* \*